United States Patent [19]

Suzuki

[11] Patent Number: 4,939,565
[45] Date of Patent: Jul. 3, 1990

[54] SEMICONDUCTOR DEVICE

[75] Inventor: Kazumi Suzuki, Fukuoka, Japan

[73] Assignee: Mitsubishi Denki Kabushiki Kaisha, Tokyo, Japan

[21] Appl. No.: 174,514

[22] Filed: Mar. 28, 1988

[30] Foreign Application Priority Data

Apr. 9, 1987 [JP] Japan ................................ 62-98110
May 15, 1987 [JP] Japan ................................ 62-119220

[51] Int. Cl.$^5$ ................... H01L 29/747; H01L 29/74
[52] U.S. Cl. ......................................... 357/39; 357/38; 357/86
[58] Field of Search ................................. 357/39, 38

[56] References Cited

U.S. PATENT DOCUMENTS 3,524,114  8/1970  Hutson ................................. 357/39

FOREIGN PATENT DOCUMENTS 0145484  11/1979  Japan ............................. 357/39 E
55-154765  12/1980  Japan .
55-158673  12/1980  Japan .
58-116768  12/1983  Japan .
61-214573  9/1986  Japan .

Primary Examiner—Rolf Hille
Assistant Examiner—Wael Fahmy
Attorney, Agent, or Firm—Oblon, Spivak, McClelland, Maier & Neustadt

[57] ABSTRACT

Upper structure (911) of a bidirectional triode thyristor has a first base layer (21) and a gate portion base layer (22) which are isolated from each other by a first isolation (1a). A first emitter layer (4) is formed in a part of a surface of the first base layer (21). A gate portion emitter layer (10) is formed in a part of a surface of the gate portion base layer (22). First main electrodes (T$_1$, 61, 62) are formed on surfaces of the first emitter layer (4) and the gate portion base layer (22), respectively. Gate electrodes T$_G$, 91, 92) are formed on surfaces of the gate portion emitter layer (10) and the first base layer (4), respectively. Lower structure (922) has a second base layer (31) and a third base layer (32) which are isolated from each other by a second isolation layer (1c). A second emitter layer (5) is formed in a part of a surface of the first base layer (31). Second electrodes (T$_2$, 7a) are electrically and directly in contact with only surfaces of the second emitter layer (5) and the second base layer (32).

18 Claims, 4 Drawing Sheets

SEMICONDUCTOR DEVICE

BACKGROUND OF THE INVENTION

1. Field of the Invention

The present invention relates to a semiconductor device, and more particularly, it relates to an improvement in a bidirectional triode thyristor.

2. Description of the Prior Art

Figure 1:
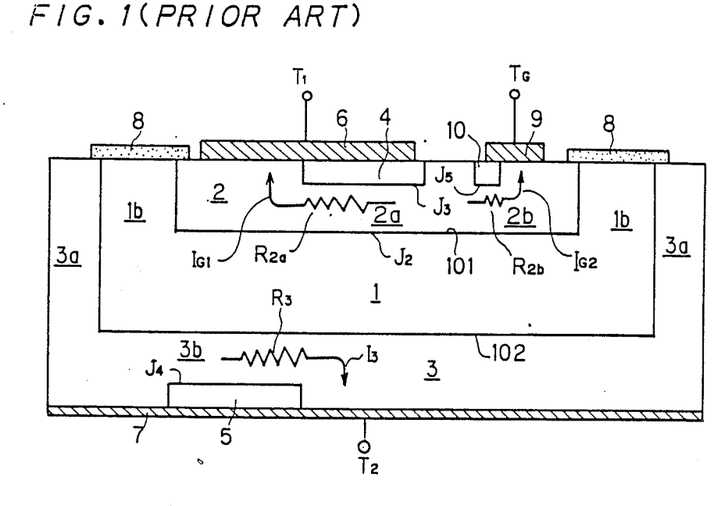
FIG. 1 is a sectional view showing a conventional bidirectional triode thyristor device.

FIG. 1 is a sectional view typically showing the structure of a conventional bidirectional triode thyristor (hereinafter referred to as "TRIAC"), which is well-known in the field of semiconductor devices. Referring to FIG. 1, a p-type first base layer 2 is formed on a first major surface 101 of an n-type semiconductor layer 1, which is prepared as a semiconductor substrate, for example. An n-type first emitter layer 4 is formed in a part of the surface of the first base layer 2, and an n-type gate portion emitter layer 10 is formed in another part of the surface of the first base layer 2. A p-type second base layer 3 is formed on a second major surface 102 of the semiconductor layer 1, and an n-type second emitter layer 5 is formed in a part of the surface of the second base layer 3. An end portion 1b of the semiconductor layer 1 is formed to enclose the side surface of the first base layer 2. Further, an end portion of the second base layer 3 is formed as an isolation region 3a enclosing the side surface of the semiconductor layer 1. A first main electrode layer 6 is formed over the surface of the first base layer 2 and the first emitter layer 4. A gate electrode layer 9 is formed over the surfaces of the first base layer 2 and the gate portion emitter layer 10. A second main electrode layer 7 is formed over the surfaces of the second base layer 3 and the second emitter layer 5. In such a TRIAC, the first main electrode layer 6 is generally called $T_1$ electrode, and the second main electrode layer 7 is called $T_2$ electrode.

It is assumed here that $V_1$ represents voltage applied to the first main electrode layer 6 ($T_1$), $V_2$ represents voltage applied to the second main electrode layer 7 ($T_2$) and $V_G$ represents voltage applied to the gate electrode layer 9 ($T_G$). It is well known that a TRIAC has the following four trigger modes expressed by relations between $V_1$, $V_2$ and $V_G$:

Mode I: $V_1 < V_2$, $V_1 < V_G$
Mode II: $V_1 < V_2$, $V_G < V_1$
Mode III: $V_2 < V_1$, $V_G < V_1$
Mode IV: $V_2 < V_1$, $V_1 < V_G$ Transverse resistance of the first base layer 2 exerts influence on the value of gate trigger current, which flows to the gate electrode layer 9 in triggering.

When the voltage $V_G$ is higher than the voltage $V_1$ in the mode I or IV, gate trigger current $I_{G1}$ flows from the gate electrode layer 9 to the first main electrode layer 6 through the first base layer 2. At this time, voltage drop $\Delta V_1$ is caused by transverse resistance $R_{2a}$ in a region 2a, which is a part of the first base layer 2 existing under the first emitter layer 4, and the gate trigger current $I_{G1}$. $\Delta V_1$ is equal to $I_{G1}R_{2a}$. The voltage drop $\Delta V_1$ increased the potential at the region 2a to be higher than that of the first emitter layer 4. Consequently, a p-n junction $J_3$ between the region 2a and the first emitter layer 4 is forward-biased so that electrons are injected into the semiconductor layer 1 from the first emitter layer 4 through the region 2a, i.e., through the first base layer 2. Thus, triggering of the TRIAc is started so that current flows between the first main electrode layer 6 and the second main electrode layer 7, the direction of the current being determined in accordance with the sign of the difference between the voltage $V_1$ and the voltage $V_2$.

When, on the other hand, the voltage $V_1$ is higher than the voltage $V_G$ in the mode II or III, gate trigger current $I_{G2}$ flows from the first main electrode layer 6 to the gate electrode layer 9 through the first base layer 2. At this time, voltage drop $\Delta V_2$ is caused on by transverse resistance $R_{2b}$ of a region 2b, which is a part of the first base layer 2 existing under the gate portion emitter layer 10, and the gate trigger current $I_{G2}$. $\Delta V_2$ is equal to $I_{G2}R_{2b}$. Consequently, a p-n junction $J_5$ between the region 2b and the gate portion emitter layer 10 is forward-biased so that electrons are injected into the semiconductor layer 1 from the gate portion emitter layer 10 through the region 2b, i.e., the first base layer 2. Thus, triggering of the TRIAC is started.

As hereinabove described, the voltage drop $\Delta V_1$ or $\Delta V_2$ caused by the gate trigger current $I_{G1}$ or $I_{G2}$ and the transverse resistance $R_{2a}$ or $R_{2b}$ of the first base layer 2 is utilized in each of the four trigger modes.

For the purpose of improving sensitivity of the TRIAC, reduction of the gate trigger current $I_{G1}$ or $I_{G2}$ is required. The transverse resistance $R_{2a}$ or $R_{2b}$, i.e., specific resistance of the first base layer 2 may be increased in order to obtain the voltage drop $\Delta V_1$ or $\Delta V_2$ of a prescribed level with smaller gate trigger current. However, such increase in specific resistance of the first base layer 2 degrades other principal characteristics such as voltage proof and commutation characteristic, etc.

On the other hand, transverse resistance $R_3$ of the second base layer 3 exerts influence on the value of gate trigger current in the modes III and IV, as hereafter described. First, electrons are injected into the semiconductor layer 1 from the first emitter layer 4 or the gate portion emitter layer 10 through the first base layer 2 by the aforementioned trigger starting operation. As a result, a p-n junction $J_2$ between the first base layer 2 and the semiconductor layer 1 is forward-biased so that positive holes are injected into the second base layer 3 this time from the first base layer 2 through the semiconductor layer 1. The positive holes thus injected into the second base layer 3 reach the second main electrode layer 7. At this time, voltage drop $\Delta V_3$ is caused by positive-hole current $I_3$ and the transverse resistance $R_3$ in a region 3b, which is a part of the second base layer 3 existing under the second emitter layer 5. $\Delta V_3$ is equal to $I_3R_3$. The voltage drop $\Delta V_3$ forward-biases a p-n junction $J_4$ between the second base layer 3 and the second emitter layer 5. As the result, injectoin of electrons from the second emitter layer 5 to the second base layer 3 is started to allow conduction of the TRIAC.

As hereinabove described, the voltage drop $\Delta V_3$ based on the current $I_3$ and the transverse resistance $R_3$ in the region 3a is utilized in the modes III and IV. The current $I_3$ is generated on the basis of the gate trigger current $I_{G1}$ or $I_{G2}$ as hereinabove described. Therefore, the transverse resistance $R_3$, i.e., specific resistance of the second base layer 3 may be increased in order to reduce the gate trigger current $I_{G1}$ or $I_{G2}$ for the purpose of improving sensitivity of the TRIAC. However, such increase in specific resistance of the second base layer 3 disadvantageously degrades other principal characteristics such as the commutation characteristic.

SUMMARY OF THE INVENTION

A semiconductor device according to the present invention comprises: a semiconductor chip having: a first semiconductor layer of a first conductivity type, a first base layer of a second conductivity type formed on a part of a first major surface of the first semicondutor layer, a gate portion base layer of the second conductivity type formed on another part of the first major surface of the first base layer, a first emitter layer of the first conductivity type formed in a part of a surface of the first base layer, a gate portion emitter layer of the first conductivity type formed in a part of a surface of the gate portion base layer, an isolaton layer formed between the first base layer and the gate portion base layer to spatially isolate the first base layer from the gate portion base layer, in which the isolation layer is different in conductive character from the first base layer and the gate portion base layer, a second base layer of the second conductivity type formed on a second major surface of the first semiconductor layer, and a second emitter layer of the first conductivity type formed in a part of a surface of the second base layer; a first layer of a first main electrode formed on a surface of the first emitter layer; a second layer of the first main electrode formed on the surface of the gate portion base layer, in which the second layer of the first main electrode is electrically connected with the first layer of the first main electrode in the exterior of the semiconductor chip; a first layer of a gate electrode formed on a surface of the gate portion emitter layer; a second layer of the gate electrode formed on the surface of the first base layer, in which second layer of the gate electrode is electrically connected with the first layer of the gate electrode in the exterior of the semiconductor chip; and a second main electrode layer formed over both of the surface of the second base layer and a surface of the second emitter layer.

According to another embodiment of the present invention, a semiconductor device comprises: a semiconductor chip having: a first semiconductor layer of a first conductivity type, a first base layer of a second conductivity type formed on a first major surface of the first semiconductor layer, a first emitter layer of the first conductivity type formed in a part of a surface of the first base layer, a gate portion emitter layer of the first conductivity type formed in another part of the surface of the first base layer, a second base layer of the second conductivity type formed on a part of a second major surface of the first semiconductor layer, a third base layer of the second conductivity type formed on another part of the second major surface of the first semiconductor layer, a second emitter layer of the first conductivity type formed in a part of a surface of the second base layer, and an isolation layer formed between the second base layer and the third base layer for spatially isolating the second base layer from the third base layer, in which the isolation layer is different in conductive character from the second base layer and the third base layer; a first main electrode layer formed over both of the surface of the first base layer and a surface of the first emitter layer; a gate portion electrode layer formed over both of the surface of the first base layer and a surface of the gate portion emitter layer to be isolated from the first main electrode layer; and a second main electrode layer electrically connecting a surface of the second emitter layer with a surface of the third base layer.

Accordingly, an object of the present invention is to obtain a semiconductor device which can be triggered by small trigger current.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
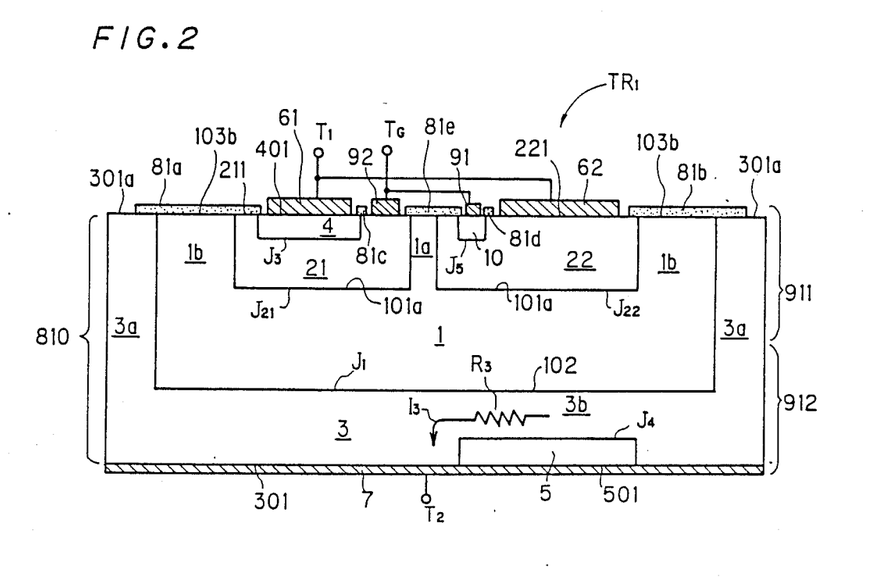
FIG. 2 is a sectional view showing a semiconductor device according to a first embodiment of the present invention.

FIG. 2 is a sectional view schematically showing a bidirectional triode thyristor (TRIAC) $TR_1$ according to a first embodiment of the present invention. The TRIAC $TR_1$ of this embodiment is different in its upper structure from that of the conventional TRIAC as shown in FIG. 1.

Figure 3:
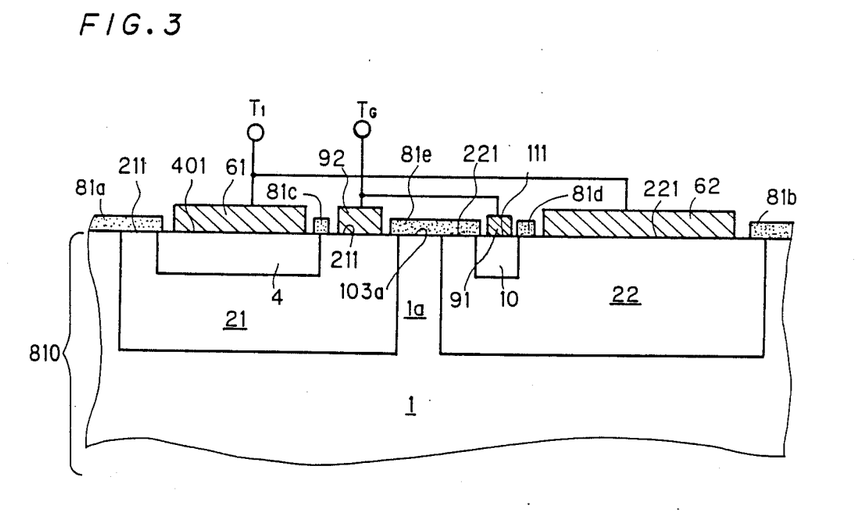
FIG. 3 is a sectional view showing an upper portion of the semiconductor device according to the first embodiment of the present invention.

Referring to FIG. 2, a p-type first base layer 21 is formed on a part of a first major surface 101a of an n-type semiconductor layer 1, which is prepared as a semiconductor substrate, for example. A gate portion base layer 22 is formed on another part of the first major surface 101a. A semiconductor isolatoin layer 1a, which is identical in material to the semiconductor layer 1, is formed between the first base layer 21 and the gate portion base layer 22. Namely, the first base layer 2 in the conventional TRIAC as shown in FIG. 1 is divided by the semiconductor isolation layer 1a into the first base layer 21 and the gate portion base layer 22 to provide the embodiment. An n-type first emitter layer 4 is formed in a part of a surface 211 of the first base layer 21. An n-type gate portion emitter layer 10 is formed in a part of a surface 221 of the gate portion base layer 22. On the other hand, a p-type second base layer 3 is formed on a second major surface 102 of the semiconductor layer 1. An n-type second emitter layer 5 is formed in a part of a surface 301 of the second base layer 3. An end portion 1b of the semiconductor layer 1 is formed to enclose outer side surfaces of the first base layer 21 and the gate portion base layer 22, so that a surface 103b of the end portion 1b is adjacent to the surface 211 of the first base layer 21 or the surface 221 of the gate portion base layer 22. An end portion of the second base layer 3 is formed as an isolatoin region 3a enclosing the side surface of the semiconductor layer 1, so that a surface 301a of the isolation region 3a is adjacent to the surface 103b of the semiconductor layer 1. Thus, a semiconductor chip 810 of this TRIAC TR₁ consists of the semiconductor layer 1, the end portion 1b, the first base layer 21, the gate portion base layer 22, the isolation layer 1a, the first emitter layer 4, the gate portion emitter layer 10, the second base layer 3, the isolation region 3a and the second emitter layer 5. FIG. 3. shows a region around the first base layer 21 and the gate portion base layer 22 in FIG. 2 as an enlarged view. Referring to FIG. 3, a first layer 61 of a first main electrode T₁ is formed on a surface 401 of the first emitter layer 4, and a second layer 62 of the first main electrode T₁ is formed on the surface 221 of the gate portion base layer 22. The first layer 61 and the second layer 62 are electrically connected with each other in ther exterior of the semiconductor chip 810. A first layer 91 of a gate electrode T_G is formed on a surface 111 of the gate portion emitter layer 10, and a second layer 92 of the gate electrode T_G is formed on the surface 211 of the first base layer 21. The first layer 91 and the second layer 92 of the gate electrode T_G are electrically connected with each other in the exterior of the semiconductor chip 810. On the other hand, as shown in FIG. 2, a second main electrode layer 7 (T₂) is formed over the surface 301 of the second base layer 3 and a surface 501 of the second emitter layer 5. Insulating layers 81a through 81e are formed on an upper surface of the semiconductor chip 810 to which the first main electrode T₁ (61 and 62) and the gate electrode T_G (91 and 92) are mounted, to cover boundaries between surfaces of different layers or regions. Namely, the insulating layer 81a covers a part of the surface 211 provided between a surface 401 of the first emitter layer 4 and the surface 103b, a part of the surface 103b adjacent to the surface 211, the boundary between the surface 401 and the surface 211, and the boundary between the surface 103b and the surface 301a. The insulating layer 81b covers a part of the surface 103b adjacent to the surface 221, the boundary between the surface 221 and the surface 103b, and the boundary between the surface 103b and the surface 301a. As shown in FIG. 3, the insulating layer 81c covers the boundary between the surface 401 and the surface 211 and the insulating layer 81d covers the boundary between the surface 221 and the surface 111, while the insulating layer 81e covers a surface 103a of the semiconductor isolation layer 1a, a part of the surface 221 adjacent to the surface 103a, the boundary between the surface 221 and the surface 111, and the boundary between the surface 103a and the surface 211.

Thus, upper structure 911 of the TRIAC TR₁ as shown in FIG. 2 is different from that of the conventional TRIAC as shown in FIG. 1, while lower structure 912 of the TRIAC TR₁ is equivalent to that of the conventional TRIAC.

Trigger operation of the TRIAC TR₁ is as follows: It is assumed here that V₁ represents voltage applied to the first main electrode T₁, V₂ represents voltage applied to the second main electrode T₂ and V_G represents voltage applied to the gate electrode T_G.

As hereinabove described, the following relation holds in the mode I:

$$V_1 < V_2, V_1 < V_G \quad \ldots (1)$$

When the voltage V₂ is set higher than the voltage V₁, depletion layers spread in a p-n junction J₂₁ between the first base layer 21 and the semiconductor layer 1 and a p-n junction J₂₂ between the gate portion base layer 22 and the semiconductor layer 1, to block current. Then the voltage V_G is made higher than the voltage V₁. Then, a p-n junction J₃ between the first emitter layer 4 and the first base layer 21 is forward-biased since the first emitter layer 4 is of n-type and the first base layer 21 is of p-type. On the other hand, a p-n junction J₅ between the gate portion emitter layer 10 and the gate portion base layer 22 is reverse-biased. On the basis of potential difference between the voltage V₁ and the voltage V_G, electrons are injected into the semiconductor layer 1 from the first emitter layer 4 through the first base layer 21. The electrons are accumulated in the semiconductor layer 1 to forward-bias a p-n junction J₁ between the semiconductor layer 1 and the second base layer 3, whereby positive holes are injected toward the semiconductor layer 1 from the second base layer 3. Consequently, the TRIAC TR₁ conducts so that main current flows from the second main electrode layer 7 to the first layer 61 of the first main electrode T₁ through the second base layer 3, the semiconductor layer 1, the first base layer 21 and the first emitter layer 4.

In the mode II, the following relation holds:

$$V_1 < V_2, V_G < V_1 \quad \ldots (2)$$

The p-n junction J₃ is reverse-biased and the p-n junction J₅ is forward-biased since the voltage V₁ is higher than the voltage V_G reversely to the mode I. On the basis of potential difference between the voltage V₁ and the voltage V_G, electrons are injected into the semiconductor layer 1 from the gate portion emitter layer 10 through the gate portion base layer 22. The electrons are accumulated in the semiconductor layer 1 to forward-bias the p-n junction J₁, whereby positive holes are injected toward the semiconuductor layer 1 from the second base layer 3. Consequently, the TRIAC TR₁ conducts so that main current flows from the second main electrode layer 7 to the first layer 61 of the first main electrode T₁ through the second base layer 3, the semiconductor layer 1, the first base layer 21 and the first emitter layer 4.

The following relation holds in the mode III:

$$V_2 < V_1, V_G < V_1 \quad \ldots (3)$$

When the voltage V₁ is made higher than the voltage V₂, a depletion layer spreads in the p-n junction J₁, to block current. Then the voltage V₁ is made higher than the voltage V_G. Then the p-n junction J₅ is forward-biased, so that electrons are injected into the semiconductor layer 1 from the gate portion emitter layer 10 through the gate portion base layer 22. The electrons are accumulated in the semiconductor layer 1 to forward-bias the p-n junction J₂₂, whereby injection of positive holes is started from the gate portion base layer 22 toward the semiconductor layer 1. The positive holes reach the second main electrode layer 7 through the semiconductor layer 1 and the second base layer 3. At this time, voltage drop ΔV₃ is caused by positive-hole current I₃ and transverse resistance R₃ in a region 3b, which is a part of the second base layer 3 existing above the second emitter layer 5. ΔV₃ is equal to I₃R₃. This voltage drop ΔV₃ forward-biases a p-n junction J₄ between the second base layer 3 and the second emitter layer 5, whereby injection of electrons is started from the second emitter layer 5 toward the second base layer 3. Consequently, the TRIAC TR₁ conducts so that main current flows from the second layer 62 of the first main electrode $T_1$ to the second main electrode layer 7 through the gate portion base layer 22, the semiconductor layer 1, the second base layer 3 and the second emitter layer 5.

In the mode IV, the following relation holds:

$$V_2 < V_1, V_1 < V_G \quad \ldots (4)$$

The p-n junction $J_3$ is forward-biased since the voltage $V_G$ is higher than the voltage $V_1$, reversely to the mode III. Electrons are injected into the semiconductor substrate 1 from the first emitter layer 4 through the first base layer 21. The electrons are accumulate in the semiconductor layer 1 to forward-bias the p-n junction $J_{21}$, whereby injection of electrons is started from the first base layer 21 toward the semiconductor layer 1. Thereafter in a similar manner to the mode III, the TRIAC $TR_1$ conducts so that main current flows from the second layer 62 of the first main electrode $T_1$ to the second main electrode layer 7 through the gate portion base layer 22, the semiconductor layer 1, the second base layer 3 and the second emitter layer 5.

Thus, according to the first embodiment, the p-n junction $J_3$ between the first base layer 21 and the first emitter layer 4 or the p-n junction $J_5$ between the gate portion base layer 22 and the gate portion emitter layr 10 is forward-biased on the basis of the potential difference between the voltage $V_1$ of the first main electrode $T_1$ and the voltage $V_G$ of the gate electrode layer $T_G$. The TRIAC $TR_1$ is triggered by injection of the electrons from the first emitter layer 4 or the gate portion emitter layer 10 into the semiconductor layer 1. Since the voltage drop based on the gate trigger current and the transverse resistance of the first base layer, which has been utilized in the conventional TRIAC, is not employed in this embodiment, the TRIAC can be triggered by trigger current which is far smaller than that in the prior art. Namely, while the conventional TRIAC requires the trigger current of at least 2 to 3 mA, the TRIAC $TR_1$ according to the first embodiment can be triggered by trigger current of several ten $\mu A$.

Figure 4:
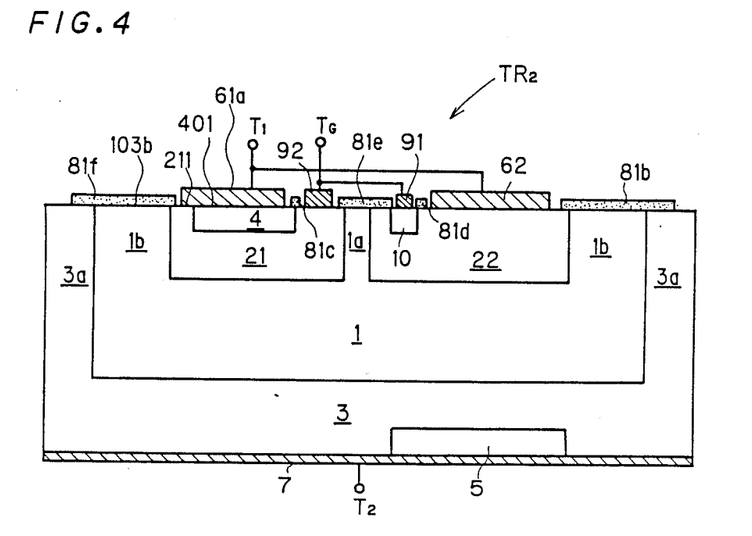
FIG. 4 is a sectional view showing a semiconductor device according to a second embodiment of the present invention.

FIG. 4 is a sectional view typically showing a TRIAC $TR_2$ according to a second embodiment of the present invention. This TRIAC $TR_2$ is substantially identical in structure to the TRIAC $TR_1$ as shown in FIG. 2, except for a position of a first layer 61a of a first main electrode $T_1$. The first layer 61a is adapted to cover not only a surface 401 of the first emitter layer 4, but also a part of a surface 211 of a first base layer 21. The insulating layer 81a in FIG. 2 is replaced by a slightly smaller insulating layer 81f in FIG. 4, which does not cover the boundary between the surface 401 and the surface 211. The TRIAC $TR_2$ needs slightly larger gate trigger current as compared with the TRIAC $TR_1$, while the former is superior in other principal characteristics, such as the commutation characteristic, to the latter. This is because carriers (positive holes) accumulated in the semiconductor layer 1 can be absorbed not only by the second layer 62 through the gate portion base layer 22 but also by the first layer 61 through the first base layer 21, so that annihilation thereof in commutation etc. is prompted.

In each of the TRIACs $TR_1$ and $TR_2$ according to the above embodiments, the semiconductor isolation layer 1a is prepared by the same material as the semiconductor layer 1, i.e., n-type semiconductor material. If the semiconductor isolation layer 1a is at least partially formed by a p-type semiconductor material which is larger in specific resistance than the first base layer 21 and the gate portion base layer 22, (dV/dt) characteristic etc. can be improved although gate trigger current is slightly increased. Thus, carriers (positive holes) accumulated in the semiconductor layer 1 can be absorbed by the second layer 62 through the second base layer 21, the isolation layer 1a and the gate portion base layer 22 in commutation. Therefore, the carriers are quickly annihilated to improve the (dV/dt) characteristics etc.

Figure 5:
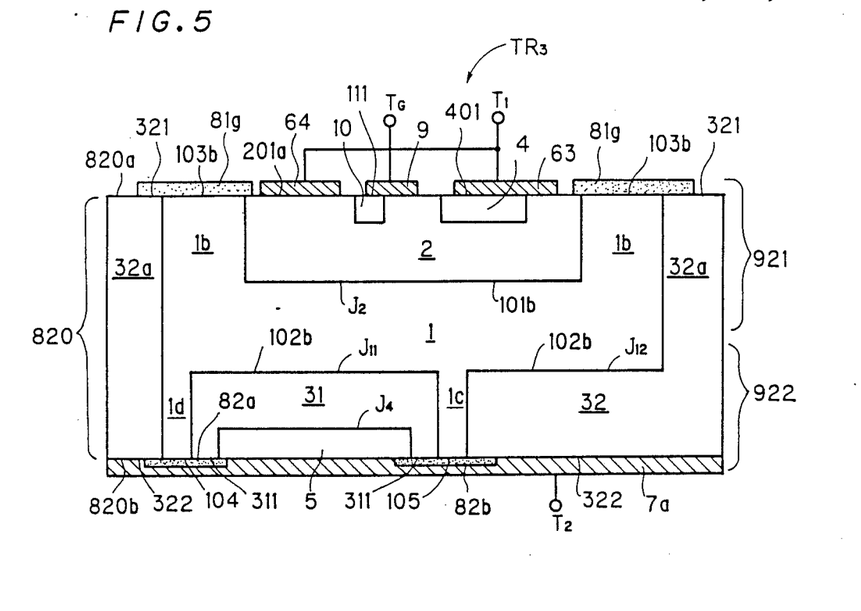
FIG. 5 is a sectional view showing a semiconductor device according to a third embodiment of the present invention.

FIG. 5 is a sectional view typically showing a TRIAC $TR_3$ according to a third embodiment of the present invention. Referring to FIG. 5, a p-type first base layer 2 is formed on a first major surface 101b of an n-type semiconductor layer 1. An n-type first emitter layer 4 is formed in a part of a surface 201a of the first base layer 2, and an n-type gate portion emitter layer 10 is formed in another part of the surface 201a of the first base layer 2. An end portion 1b of the semiconductor layer 1 is formed to enclose the side surface of the first base layer 2. On the other hand, a p-type second base layer 31 is formed on a part of a second major surface 102b of the semiconductor layer 1. A third base layer 32 is formed on another part of the second major surface 102b of the semiconductor layer 1. An end portion of the third base layer 32 is formed as an isolation region 32a enclosing the side surface of the semiconductor layer 1. A semiconductor isolation layer 1c, which is identical in material to the semiconductor layer 1, is formed between the second base layer 31 and the third base layer 32. Another semiconductor layer 1d of the same material as the semiconductor layer 1 is formed between the second base layer 21 and the isolation region 32a. Namely, the second base layer 3 of the conventional TRIAC as shown in FIG. 1 is divided by the semiconductor isolation layers 1c and 1d, as shown in FIG. 5, into the second base layer 31 and the third base layer 32. An n-type second emitter layer 5 is formed in a part of a surface 311 of the second base layer 31. Thus, a semiconductor chip 820 of the TRIAC $TR_3$ consists of the semiconductor layer 1, the end portion 1b, the first base layer 2, the second base layer 31, the third base layer 32, the isolation region 32a, the semiconductor isolation layers 1c and 1d, the first emitter layer 4, the gate portion emitter layer 10 and the second emitter layer 5. An insulating layer 81g is formed on an upper surface 820a of the semiconductor chip 820 to cover a surface 103b of the end portion 1b, the boundary between the surface 201a of the first base layer 2 and the surface 103b of the end portion 1b and the boundary between the surface 103b of the end portion 1b and an upper surface 321 of the isolation region 32a. An insulating layer 82a is formed on a lower surface 820b of the semiconductor chip 820 to cover a part of the surface 311 of the second base layer 31, a surface 104 of the semiconductor isolation layer 1d, the boundary between the surface 311 of the secone base layer 31 and a surface 501 of the second emitter layer 5, and the boundary between the surface 104 and a lower surface 322 of the isolation region 32a. Further, an insulating layer 82b is formed to cover a part of the surface 311 of the second base layer 21, a surface 105 of the isolation layer 1c, the boundary between the surface 311 and the surface 501, and the boundary between the surface 105 and the surface 322 of the third base layer 32. First main electrode layers 63 and 64 are formed on the surface 201a of the first base layer 2, to be electrically connected with each other in the exterior of the semiconductor chip 820. In particular, the first main electrode layer 63 is formed over the surface 201a and a surface 401 of the first emitter layer 4. A gate electrode layer 9 is formed over a surface 201a of the first base layer 2 and a surface 111 of the gate portion emitter layer 10. A second main electrode layer 7a covers the insulating layers 82a and 82b and portions of the lower surface 820b of the semiconductor chip 820 other than those covered by the insulating layers 82a and 82b. Namely, the second main electrode layer 7a is directly in contact with the second emitter layer 5 and the third base layer 32, while being insulated from the second base layer 31 by the insulating layers 82a and 82b. Thus, while upper structure 921 of the TRIAC TR$_3$ is equivalent to that of the conventional TRIAC, lower structure 922 of the TRIAC TR$_3$ is different from that of the conventional TRIAC.

The TRIAC TR$_3$ according to the third embodiment has excellent trigger sensitivity in the modes III and IV. In the mode III, voltage V$_1$ at the first main electrode layers 63 and 64 is set to be higher than voltage V$_2$ at the second main electrode layer 7a, whereby depletion layers spread in a p-n junction J$_{11}$ between the semiconductor layer 1 and the second base layer 31 and a p-n junction J$_{12}$ between the semiconductor layer 1 and the third base layer 32. When the voltage V$_1$ is set to be higher than voltage V$_G$ at the gate electrode layer 9 in this state, electrons are injected into the semiconductor layer 1 from the gate portion emitter layer 10 through the first base layer 2, as hereinabove described. The electrons are accumulated in the semiconductor layer 1 to forward-bias a p-n junction J$_2$ between the semiconductor layer 1 and the first base layer 2, whereby positive holes are injected into the second base layer 31 and the third base layer 32 from the first base layer 2 through the semiconductor layer 1. Since the second base layer 31 is not directly in contact with the second main electrode layer 7a, the positive holes injected into the second base layer 31 are not directly absorbed by the second main electrode layer 7a but accumulated therein, to forward-bias a p-n junction J$_4$ between the second base layer 31 and the second emitter layer 5. Consequently, the TRIAC TR$_3$ conducts only with injection of a small amount of positive holes into the second base layer 31. Therefore, gate trigger current I$_G$ following in the gate electrode layer 9 in triggering is reduced as compared with the prior art.

In the mode IV, the voltage V$_1$ is set to be higher than the voltage V$_2$, and the voltage V$_G$ is set to be higher than the voltage V$_1$. Then electrons are injected into the semiconductor layer 1 from the first emitter layer 4 through the first base layer 2 as hereinabove described. The electrons forward-bias the p-n junction J$_2$, so that positive holes are injected into the second base layer 31 and the third base layer 32 from the first base layer 2 through the semiconductor layer 1. Phenomenon thereafter is similar to that of the mode III, and the TRIAC TR$_3$ conducts only by injection of a small amount of positive holes into the second base layer 31. Therefore, the gate trigger current I$_G$ flowing in the gate electrode layer 9 at this time is reduced as compared with the prior art.

In the modes I and II, the second emitter layer 5 has no relation to trigger operation in conduction of the third base layer 32, and hence the TRIAC TR$_3$ has the same trigger performance as the prior art.

Thus, according to the third embodiment, the positive holes caused by the trigger current and injected into/accumulated in the second base layer 31 forward-bias the p-n junction J$_4$, to allow conduction of the TRIAC TR$_3$. Thus, the present invention utilizes no voltage drop based on transverse resistance of the second base region, which has been utilized in the conventional TRIAC, whereby the TRIAC is triggered with trigger current smaller than that in the conventional case.

Figure 6:
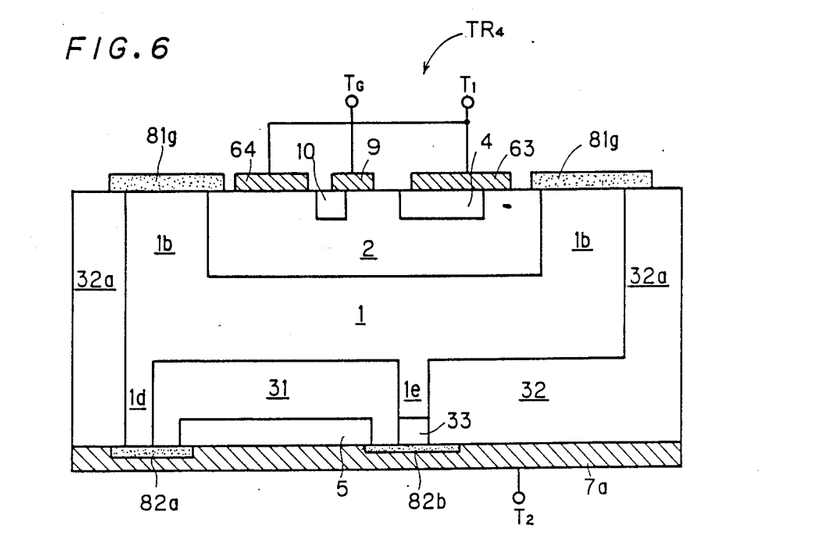
FIG. 6 is a sectional view showing a semiconductor device according to a fourth embodiment of the present invention.

FIG. 6 is a sectional view schematically showing a TRIAC TR$_4$ according to a fourth embodiment of the present invention. This TRIAC TR$_4$ is substantially identical in structure to the TRIAC TR$_3$ as shown in FIG. 5, except for that the semiconductor isolation layer 1c is divided into an n-type semiconductor isolation layer 1e and a p-type semiconductor isolation layer 33. The semiconductor isolation layer 33 is formed by a p-type semiconductor material which is larger in specific resistance than the second base layer 31 and the third base layer 32. Thus, carriers (positive holes) accumulated in the semiconductor layer 1 can be absorbed by the second main electrode layer 7a not only directly through the third base layer 32 but also through the second base layer 31, the semiconductor isolation layer 33 and the third base layer 32 in commutation. Therefore, the carriers are quickly annihilated, thereby to improve principal characteristics such as the (dV/dt) characteristic.

Figure 7:
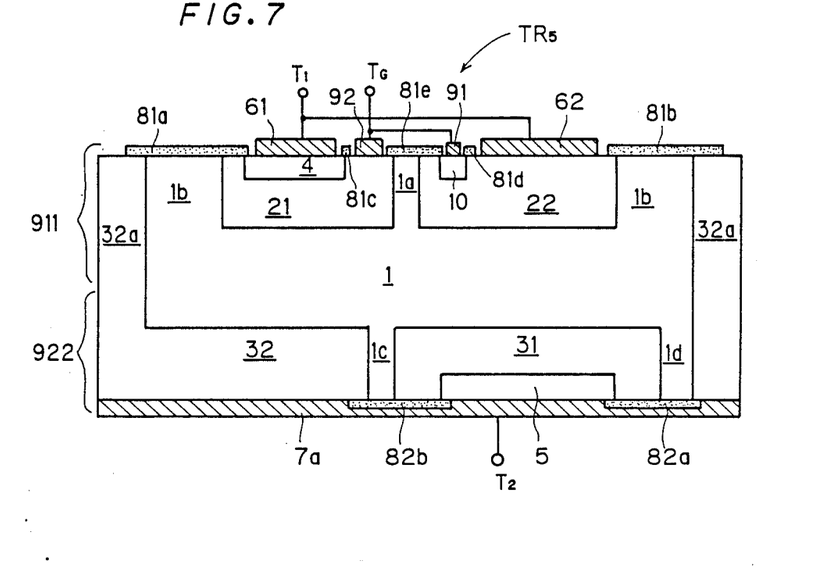
FIG. 7 is a sectional view showing a semiconductor device according to a fifth embodiment of the present invention.

FIG. 7 is a sectional view schematically showing a TRIAC TR$_5$ according to a fifth embodiment of the present invention. Upper structure 911 of the TRIAC TR$_5$ as shown in FIG. 7 is equivalent to the upper structure 911 of the TRIAC TR$_1$ according to the first embodiment, while lower structure 922 thereof is equivalent to the lower structure 922 of the TRIAC TR$_3$ according to the third embodiment as shown in FIG. 5. Thus, the TRIAC TR$_5$ has respective effects of the first and third embodiments, such that trigger current thereof is extremely small as compared with the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor chip having:
   a first semiconductor layer of a first conductivity type,
   a first base layer of a second conductivity type formed on a part of a first major surface of said first semiconductor layer,
   a gate portion base layer of said second conductivity type formed on another part of said first major surface of said first semiconductor layer,
   a first emitter layer of said first conductivity type formed in a part of a surface of said first base layer,
   a gate portion emitter layer of said first conductivity type formed in a part of a surface of said gate portion base layer,
   an isolation layer formed between said first base layer and said gate portion base layer to spatically isolate said first base layer from said gate portion base layer, said isolation layer being different in conductive character from said first base layer and said gate portion base layer,
   a second base layer of said second conductivity type formed on a second major surface of said first semiconductor layer, and a second emitter layer of said first conductivity type formed in a part of a surface of said second base layer;

a first layer of a first main electrode formed on a surface of said first emitter layer;

a second layer of said first main electrode formed on said surface of said gate portion base layer, said second layer of said first main electrode being electrically connected with said first layer of said first main electrode in the exterior of said semiconductor chip;

a first layer of a gate electrode formed on a surface of said gate portion emitter layer;

a second layer of said gate electrode formed on said surface of said first base layer, said second layer of said gate electrode being electrically connected with sid first layer of said gate electrode in the exterior of said semiconductor chip; and a second main electrode layer formed over both of said surface of said second base layer and a surface of said second emitter layer.

2. A semiconductor device in accordance with claim 1, wherein
said isolatoin layer is formed by a semiconductor material of said first conductivity type.

3. A semiconductor device in accordance with claim 1, wherein
said isolation layer is formed by a semiconductor material of said second conductivity type, and includes a portion which is larger in specific resistance than both of said first base layer and said gate portion base layer.

4. A semiconductor device in accordance with claim 1, wherein
said first layer of said first main electrode is formed over both of said surfaces of said first emitter layer and said first base layer.

5. A semiconductor device in accordance with claim 4, wherein
said isolation layer is formed by a semiconductor material of said first conductivity type.

6. A semiconductor device in accordance with claim 4, wherein
said isolation layer is formed by a semiconductor material of said second conductivity type, and includes a portion which is larger in specific resistance than both of said first base layer and said gate portion base layer.

7. A semiconductor device comprising:
a semiconductor chip having:
a first semiconductor layer of a first conductivity type,
a first base layer of a second conductivity type formed on a first major surface of said first semiconductor layer,
a first emitter layer of said first conductivity type formed in a part of a surface of said first base layer,
a gate portion emitter layer of said first conductivity type formed in another part of said surface of said first base layer,
a second base layer of said second conductivity type formed on a part of a second major surface of said first semiconductor layer,
a third base layer of said second conductivity type formed on another part of said second major surface of said first semiconductor layer, a second emitter layer of said first conductivity type formed in a part of a surface of said second base layer, and an isolation layer formed between said second base layer and said third base layer for spatially isolating said second base layer from said third base layer, said isolation layer being different in conductive character from said second base layer and said third base layer;

a first main electrode layer formed over both of said surface of said first base layer and a surface of said first emitter layer;

a gate portion electrode layer formed over both of said surface of said first base layer and a surface of said gate portion emitter layer to be isolated from said first main electrode layer; and a second main electrode layer electrically connecting a surface of said second emitter layer with a surface of said third base layer.

8. A semiconductor device in accordance with claim 7, wherein
said isolation layer is formed by a semiconductor material of said first conductivity type.

9. A semiconductor device in accordance with claim 7, wherein
said isolation layer is formed by a semiconductor material of said second conductivity type, and includes a portion being larger in specific resistance than said second base layer and said third base layer thereby improving a dv/dt characteristic of the device.

10. A semiconductor device in accordance with claim 7, further including an insulating layer formed on both of the bottom surfaces of said second base layer and said isolation layer,
said second main electrode layer being electrically insulated from said second base layer and said isolation layer by said insulating layer.

11. A semiconductor device comprising:
a semiconductor chip being having:
a first semiconductor layer of a first conductivity type,
a first base layer of a second conductivity type formed on a part of a first major surface of said first semiconductor layer,
a gate portion base layer of said second conductivity type formed on another part of said first major surface of said first semiconductor layer,
a first emitter layer of said first conductivity type formed in a part of a surface of said first base layer,
a gate portion emitter layer of said first conductivity type formed in a part of a surface of said gate portion base layer,
a first isoolation layer formed between said first base layer and said gate portion base layer for spatially isolating said first base layer from said gate portion base layer, said first isolation layer being different in conductive character from said first base layer and said gate portion base layer,
a second base layer of said second conductivity type formed on a part of a second major surface of said first semiconductor layer,
a third base layer of said second conductivity type formed on another part of said second major surface of said first semiconductor layer,
a second emitter layer of said first conductivity type formed in a part of a surface of said second base layer, and a second isolation layer formed between said second base layer and said third base layer for spatially isolating said second base layer from said third base layer, said second isolation layer being different in conductive character from said second base layer and said third base layer;

a first layer of a first main electrode formed on a surface of said first emitter layer;

a second layer of said first main electrode formed on said surface of said gate portion base layer, said second layer of said first main electrode being electrically connected with said first layer of said first main electrode in the exterior of said semiconductor chip;

a first layer of a gate electrode formed on a surface of said gate portion emitter layer;

a second layer of said gate electrode formed on said surface of said first base layer, said second layer of said gate electrode being electrically connected with said first layer of said gate electrode in the exterior of said semiconductor chip; and a second main electrode layer electrically connecting surfaces of said second emitter layer and said third base layer with each other.

12. A semiconductor device in accordance with claim 11, further including an insulating layer formed on both of said surfaces of said second base layer and said second isolation layer, said second main electrode layer being electrically insulated from said second base layer and said second isolation layer by said insulating layer.

13. A semiconductor device in accordance with claim 11, wherein
said first layer of said first main electrode is formed over both of said surfaces of said first emitter layer and said first base layer.

14. A semiconductor device in accordance with claim 13, further including an insulating layer formed on both of said surfaces of said second base layer and said second isolation layer,
said second main electrode layer being electrically insulated from said second base layer and said second isolation layer by said insulating layer.

15. A device accordin to claim 1, further comprising:
a first insulation layer making direct contact with a top portion of said second base layer, a top portion of said first semiconductor layer and a top portion of said first base layer.

16. A device according to claim 15, wherein said first insulation layer makes direct contact with a top portion of said surface of said first emitter layer.

17. A device according to claim 1, wherein the lower surface of said first layer of said first main electrode has an interface which consists of a contact region with a part of the upper surface of said first emitter layer.

18. A device according to claim 1, wherein the lower surface of said first layer of said first main electrode makes contact which is limited to a top portion of said first base layer and to a top portion of said first emitter layer.

* * * * *

UNITED STATES PATENT AND TRADEMARK OFFICE
CERTIFICATE OF CORRECTION

PATENT NO. : 4,939,565
DATED : JULY 3, 1990
INVENTOR(S) : KAZUMI SUZUKI

It is certified that error appears in the above-identified patent and that said Letters Patent is hereby corrected as shown below:

On the title page, item [30]:

In the Foreign Application Priority Data, delete "62-98110" and insert --62-89110--.

Signed and Sealed this

Twenty-fourth Day of September, 1991

Attest:

HARRY F. MANBECK, JR.

*Attesting Officer*  *Commissioner of Patents and Trademarks*